US006199192B1

(12) United States Patent
Marquez et al.

(10) Patent No.: US 6,199,192 B1
(45) Date of Patent: Mar. 6, 2001

(54) METHOD AND APPARATUS FOR ASSIGNING SIGNAL ROUTES VIA AN INTERCONNECT-MULTIPLEXER IN A PLD

(75) Inventors: Jose M. Marquez, San Jose; Hua Xue, Sunnyvale, both of CA (US)

(73) Assignee: Xilinix, Inc., San Jose, CA (US)

( * ) Notice: Subject to any disclaimer, the term of this patent is extended or adjusted under 35 U.S.C. 154(b) by 0 days.

(21) Appl. No.: 09/036,535

(22) Filed: Mar. 6, 1998

(51) Int. Cl.$^7$ .................................................. G06F 17/50

(52) U.S. Cl. .............................. 716/12; 716/13; 716/14; 716/7

(58) Field of Search ................... 395/500.08, 500.13, 395/500.17; 326/38, 39, 41; 716/12, 13, 14, 7

(56) References Cited

U.S. PATENT DOCUMENTS

| 5,128,871 | * | 7/1992 | Schmitz ......................... 395/500.18 |
| 5,563,528 |   | 10/1996 | Diba et al. ............................. 326/39 |
| 5,648,912 | * | 7/1997 | Narayanan et al. ............ 395/500.19 |
| 5,734,592 | * | 3/1998 | Cox et al. ............................. 702/179 |

OTHER PUBLICATIONS

Diestel, R., "Graph Theory", Springer–Verlag, New York, May 1997, pp. 4–6 May 1997.*
Kelsen, P., "Fast Parallel Matching in Expander Graphs", Proceedings of the 5th Annual ACM Symposium on Parallel Algorithms and Architectures, pp. 293–299 Jul. 1993.*
Balas, E., Miller, D., Pekny, J., and Toth, P., "A Parallel Shortest Augmenting Path Algorithm for the Assignment Problem", Journal of the Association for Computing Machinery, vol. 38, No. 4, pp. Oct. 1991, 985–1004.*

Gabow, H.N., and Tarjan, R.E., "Faster Scaling Algorithms for General Graph–Matching Problems", Journal of the Association for Computing Machinery, vol. 38, No. 4, Oct. 1991, pp. 815–853.*
Galil, Z., "Efficient Algorithms for Finding Maximum Matching in Graphs", Computing Surveys, vol. 18, No. 1, Mar. 1986, pp. 23–38.*
Osiakwan, C.N.K., and Akl, S.G., "A Perfect Speedup Parallel Algorithm for the Assignment Problem on Complete Weighted Bipartite Graphs", International Conference on Databases, Parallel Architectures and Their Applications, Mar. 1990, pp. 293–301.*
Demjanenko, M. and Upadhyaya, S.J., "Yield Enhancement of Field Programmable Logic Arrays by Inherent Component Redundancy", IEEE Transactions on Computer–Aided Design of Integrated Circuits and Systems, vol. 8, No. 8, Aug. 1990, pp. 876–884.*

(List continued on next page.)

Primary Examiner—Kevin J. Teska
Assistant Examiner—Vuthe Siek
(74) Attorney, Agent, or Firm—LeRoy D. Maunu; T. Lester Wallace; Edel M. Young

(57) ABSTRACT

A system and method for routing signals to function blocks of a programmable logic device (PLD) via an interconnect multiplexer (XMUX). All available paths from an interconnect multiplexer input resource to an interconnect multiplexer output resource are first identified. Signals are assigned to XMUX paths in order of number of fanouts to function blocks. The signal required by the most function blocks is assigned first. The costs of the XMUX paths relative to the signal to be assigned are determined, and the signal is assigned to the path having the least cost. The process is repeated until all the signals are assigned. A recovery method uses augmenting paths to assign signals if all the signals could not be assigned using least cost paths assignment.

22 Claims, 9 Drawing Sheets

OTHER PUBLICATIONS

Yeung, K.L. and Yum, T.-S.P., "A Wavelength Concentrator for WDMA Networks", IEEE Global Telecommunications Conference, Dec. 1993, pp. 144–148 vol. 1.*

Efrat, A. and Itai, A., "Improvements on Bottleneck Matching and Related Problems Using Geometry", Proceedings of the 12th Annual Symposium on Computational Geometry, May 1996, pp. 301–310.*

Gary Chartrand and Ortrud R. Oellermann, "Applied and AlgorithmicGraphTheory",Copyright1993by McGraw–Hill, Inc.; Chapter 6, pp. 161–177.

S. Brown et al., "Field–Programmable Gate Arrays", Copyright 1992 by Kluwer Academic Publishers, pp. 132–145.

* cited by examiner

METHOD AND APPARATUS FOR ASSIGNING SIGNAL ROUTES VIA AN INTERCONNECT-MULTIPLEXER IN A PLD

FIELD OF THE INVENTION

The present invention generally relates to assigning signal routes in a programmable logic device, and more particularly to assigning signal routes via an interconnect multiplexer in a programmable logic device.

BACKGROUND OF THE INVENTION

Programmable logic devices (PLDs) typically make use of one or more interconnect arrays that are programmed via an array of memory cells (e.g., EPROM, EEPROM Flash EPROM or Flash EEPROM cells) to make the various interconnections within the PLD that are specific to a desired design. Because advances in the art allow regular increases in the complexity of PLDs, the size of the programmable interconnect array must also be increased to achieve the desired PLD complexity.

Unfortunately, a problem exists in assigning signals to routes or paths provided by the programmable interconnect array in the PLD. U.S. Pat. No. 5,563,528, entitled, Multiplexer for Programmable Logic Device, to Diba et al., illustrates an example of a programmable interconnect array for which routing signals may be difficult. Specifically, an interconnect-multiplexer (XMUX) is used to direct signals to a plurality of function blocks in a PLD. The XMUX has multiple input resources, each of which is connectable to at least three output resources. Therefore, the problem is one of assigning the multiple signals that are required for various ones of the function blocks to the available input and output resources of the XMUX. A successful assignment requires that all the signals be assigned to paths provided by the XMUX, such that the functional blocks will receive the required signals.

A prior method for assigning signals to XMUX paths does so on a function block by function block basis. The method first orders function blocks by the number of input signals required by the function block. The function block requiring the most input signals is processed first. That is, signals required by this function block are assigned to XMUX paths first. Since the signals associated with the last function block to be processed will be the most difficult to assign to XMUX paths, it is desirable to save the function block needing the fewest signals until last.

If all of the signals required by one function block could not be assigned to paths of the XMUX, then a version of the Hungarian algorithm is applied to signals required by the function block such that signals are reassigned to different XMUX paths. The Hungarian algorithm is described in "Applied and Algorithmic Graph Theory" by Chartrand and Oellermann, McGraw Hill. If the Hungarian algorithm fails to assign all signals to paths of the XMUX for the function block, then the assignment process has failed. It will be appreciated that even though there may be a combination of assignments of signals to XMUX paths that results in all signals being assigned, present methods are not sophisticated enough to redo signal assignments between function blocks.

Therefore, while prior methods sometimes function effectively to assign signals to input/output resources of an interconnect array, they sometimes are unable to assign all signals, even though such a solution exists. A method that addresses the aforementioned problems is therefore desirable.

SUMMARY OF THE INVENTION

In a first embodiment of the invention, a method is provided for assigning signals required by function blocks of a programmable logic device to interconnect multiplexer input resources and assigning the interconnect multiplexer input resources to interconnect multiplexer output resources. The method comprises the steps of: (a) identifying all available paths from an interconnect multiplexer input resource to an interconnect multiplexer output resource; (b) for a signal that has a greatest fanout and that is not assigned to a path, determining the cost of each path not in use; (c) selecting a path having the least cost; (d) assigning the signal to the path selected; and (e) repeating steps (b)–(d) until all the signals have been assigned.

An apparatus for assigning signals required by function blocks of a programmable logic device to interconnect multiplexer input resources and assigning the interconnect multiplexer input resources to interconnect multiplexer output resources is provided in another embodiment of the invention. The apparatus comprises: means for identifying all available paths from an interconnect multiplexer input resource to an interconnect multiplexer output resource; for a signal that has a greatest fanout and that is not assigned to a path, means for determining the cost of each path not in use; means for selecting a path having the least cost; means for assigning the signal to the path selected; and means for repeating determination of the cost of each path, selection of a path, and assignment of a signal until all the signals have been assigned.

In another embodiment, a computer readable medium is provided that comprises instructions for causing a computer to assign signals required by function blocks of a programmable logic device to interconnect multiplexer input resources and assign the interconnect multiplexer input resources to interconnect multiplexer output resources. The instructions cause the computer to perform the steps of: (a) identifying all available paths from an interconnect multiplexer input resource to an interconnect multiplexer output resource; (b) for a signal that has a greatest fanout and not assigned to a path, determining the cost of each path not in use; (c) selecting a path having the least cost; (d) assigning the signal path selected; and (e) repeating steps (b)–(d) until all the signals have been assigned The above summary of the present invention is not intended to describe each embodiment of the present invention. The figures and detailed description that follow provide additional example embodiments and aspects of the present invention.

BRIEF DESCRIPTION OF THE DRAWINGS

Other aspects and advantages of the invention will become apparent upon seeing the following detailed description and upon reference to the drawing in which.

Figure 1:
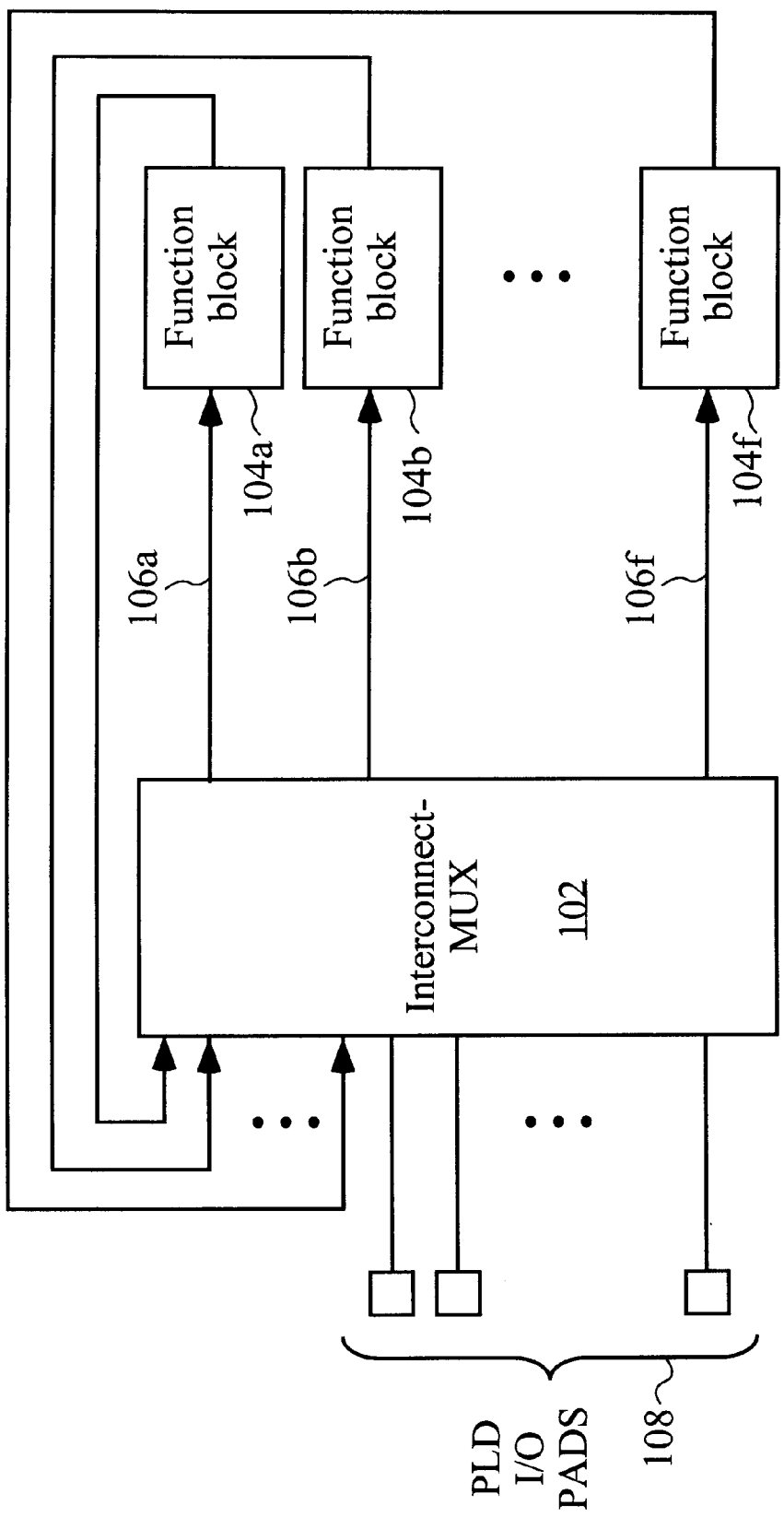
FIG. 1 is a functional block diagram of an XMUX having various input/output resources and coupled to multiple function blocks.

While the invention is susceptible to various modifications and alternative forms, specific embodiments thereof have been shown by way of example in the drawings and will herein be described in detail. It should be understood, however, that the detailed description is not intended to limit the invention to the particular forms disclosed. On the contrary, the intention is to cover all modifications, equivalents, and alternatives falling within the spirit and scope of the invention as defined by the appended claims.

DETAILED DESCRIPTION OF THE DRAWINGS

The present invention is believed to be applicable to a variety of systems for routing signals to function blocks in a PLD. The present invention has been found to be particularly applicable and beneficial in assigning signals to input and output resources of an interconnect multiplexer (XMUX). While the present invention is not so limited, an appreciation of the present invention is best presented by way of a particular example application, in this instance, in the context of an XMUX for a PLD.

FIG. 1 is a functional block diagram of an XMUX having various input/output resources and coupled to multiple function blocks. XMUX 102 is an example programmable interconnect array, such as that disclosed by Diba and Silver in U.S. Pat. No. 5,563,528. Function blocks 104a, 104b, . . . 104f are coupled to XMUX 102 via signal lines 106a, 106b, . . . , 106f, respectively. Each of signal lines 106a–f represents a plurality of signal lines that are coupled to output resources of XMUX 102, and each of function blocks 104a–f has a respective dedicated set of output resources of XMUX 102. XMUX 102 has input resources coupled to outputs of function blocks 104a–f and to PLD input/output pads 108. The input resources of XMUX 102 that are coupled by XMUX 102 to function blocks 104a–f provide feedback signals to function blocks 104a–f.

Note that outputs of function blocks 104a–f are inputs to XMUX 102 and inputs to function blocks 104a–f are outputs of XMUX 102. For the purpose of discussing the present invention, all the inputs to XMUX 102 are generally referred to as input resources and outputs from XMUX 102 are referred to as output resources.

A generalized description of the task to be performed by the present invention involves routing a plurality of signals to the plurality of function blocks via XMUX 102. If signals $a_1, a_2, a_3, \ldots, a_n$ need to be routed to function blocks 104a–f, XMUX 102 has input resources $x_1, x_2, x_3, \ldots x_m$, and output resources $y_1, y_2, y_3, \ldots, y_k$, function block 104a needs certain ones of signal $a_{1-n}$, function block 104b needs certain ones of signals $a_{1-n}, \ldots,$ and function block 104f needs certain ones of signals $a_{1-n}$, then for each of function blocks 104a–f the assignment method must assign signals $a_{1-n}$, to necessary pairs of input/output resources $X_{1-m}$ and $Y_{1-k}$ such that all of function blocks 104a–f receive the required ones of signals $a_{1-n}$. It will be appreciated that for the example XMUX 102, each input resource of XMUX 102 is connectable to at least three output resources.

The present invention views all function blocks 104a–f along with their required signals $a_{1-n}$ when assigning signals to input-output resources of XMUX 102. This differs from prior approaches where the signal requirements of each function block 104a–f were considered individually rather than factoring in signal requirements of the other ones of the function blocks. As explained above, the one of function blocks 104a–f needing the most ones of signals $a_{1-n}$ is processed first according to the prior method of assigning signals. In contrast, the present invention considers the number of fanouts for each of the signals $a_{1-n}$ along with cost of choosing one XMUX 102 path over another path. A path consists of one XMUX input resources $x_{1-m}$ paired with one of XMUX output resources $Y_{1-k}$. As will become clear in the discussion that accompanies the following figures, the present invention is likely to achieve a high success rate in assigning all the required signals to the available paths of XMUX 102.

As explained in further detail later in this description, the present invention uses a minimal cost function, relative to paired inputs and outputs, to route a signal. The cost function minimizes the impact of assigning a signal to a particular path by choosing a path that leaves the greatest number of other paths available for routing other signals.

Figure 2:
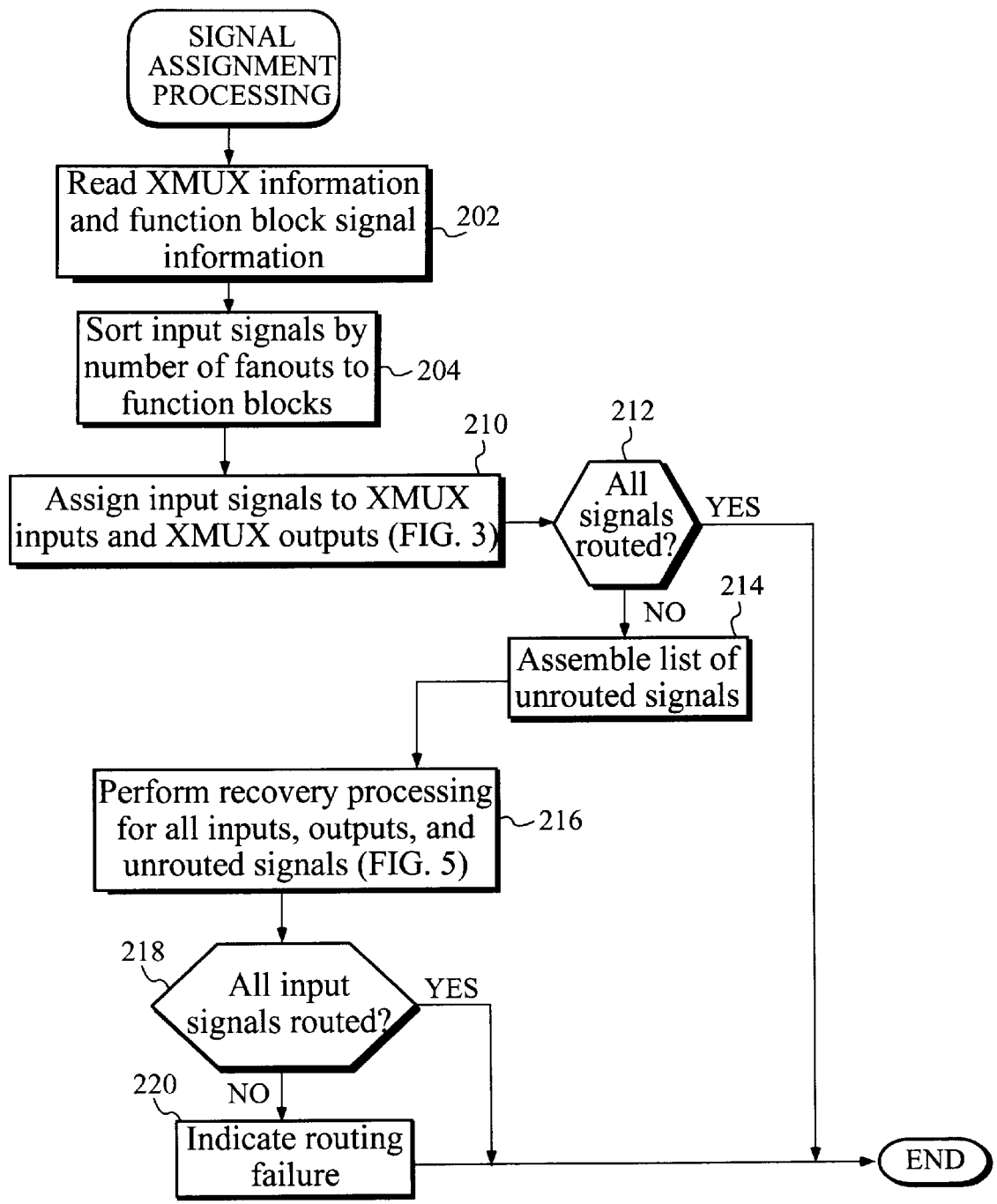
FIG. 2 is a flowchart of an example method for assigning signal paths to XMUX input/output resources according to an embodiment of the present invention.

FIG. 2 is a flowchart of an example method for assigning signals to XMUX input/output resources according to an embodiment of the present invention. In various example embodiments, the method is implemented in software that is executable on a variety of data processing systems. Depending upon user requirements, a sufficiently powerful personal computer or an engineering workstation may be utilized. The method of FIG. 2 is used in conjunction with the methods described in FIGS. 3–5 to assign signals to paths. A specific example is included along with the discussion of FIGS. 2–5 to better illustrate the example method.

At block 202, XMUX information and the function blocks' requirements for signals are read. The XMUX information includes which output resources $Y_{1-k}$ are connectable to which input resources $x_{1-m}$, and the function blocks' (FB) requirements include which signals $a_{1-n}$ are required by which of the function blocks 104a–f. For example the following information is read:

| XMUX output | XMUX inputs | | |
|---|---|---|---|
| 0 | 1 | 2 | 3 |
| 1 | 4 | 5 | 3 |
| 2 | 6 | 7 | 4 |
| 3 | 6 | 2 | 5 |
| 4 | 7 | 1 | |

| Signal routing requirements: | | | | | |
|---|---|---|---|---|---|
| FB1: | A | B | C | D | E |
| FB2: | A | B | C | D | F |

It will be appreciated that, in the interest of brevity, the example is minimal as compared to real-world scenarios, but is sufficient to convey various aspects of the present invention. At block 204, the input signals are sorted by the number of fanouts to function blocks. Accordingly, signal A fans out to two FBs, signal B fans out to two FBs, signal C fans out to two FBs, signal D fans out to two FBs, signal E fans out to one FB, and signal F fans out to one FB. The input signals as sorted by the number of fanouts to FBs are:

A B C D E F

At block 210, the signals are assigned to the XMUX inputs and XMUX outputs. (The assignment process is described further in FIGS. 3 and 4.)

After the assignment process completes, control is directed to block 212 to test whether all the signals were assigned to XMUX paths. If so, processing is complete. Otherwise, control is directed to block 214 where the unrouted signals are identified and assembled into a list for processing.

At block 216, a recovery process is run in an attempt to reassign signals to paths. The process of block 216 is described further in FIG. 5. As indicated by blocks 218 and 220, if the recovery process successfully assigned all signals to XMUX paths, then processing is complete. Otherwise, a failure indicator is provided.

Figure 3:
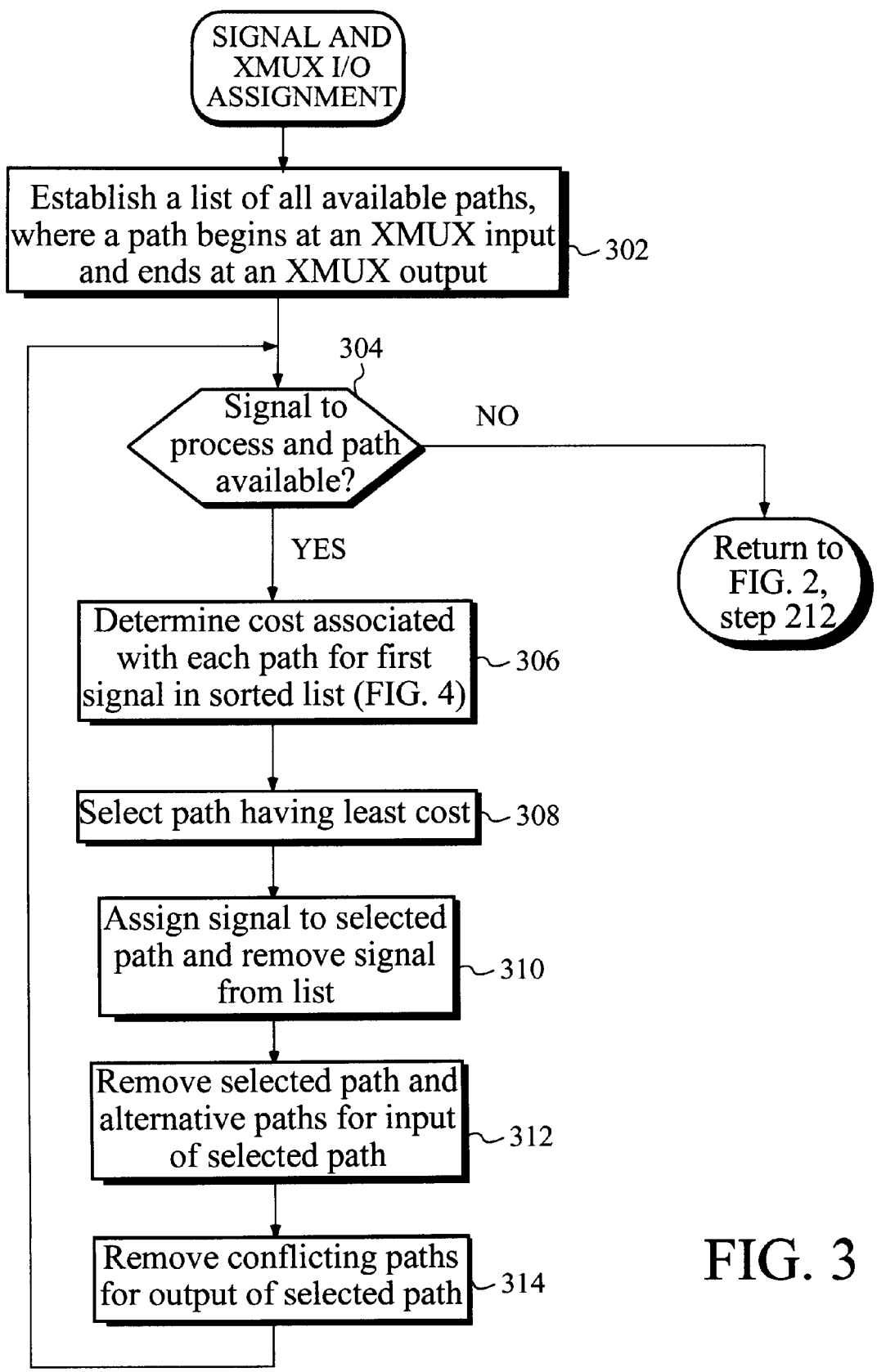
FIG. 3 is a flowchart of the detail of the assignment step of FIG. 2.

FIG. 3 is a flowchart of an example method for assigning signals to XMUX input and output resources. The discussion of this method will continue the example begun in the discussion of FIG. 2. At block 302, a list of all available paths is established. Recall that a path begins at an XMUX input and ends at an XMUX output, and that each function block has its own dedicated set of XMUX outputs. Thus, path 1→0 of FB1 is distinct from path 1→0 of FB2. The following is a table of the possible paths in the example set forth above. The table may be stored in any of a variety of data structures in the system that hosts a software embodiment of the invention.

| FB1 input/output | FB2 input/output |
|---|---|
| 1 → 0 | 1 → 0 |
| 2 → 0 | 2 → 0 |
| 3 → 0 | 3 → 0 |
| 4 → 1 | 4 → 1 |
| 5 → 1 | 5 → 1 |
| 3 → 1 | 3 → 1 |
| 6 → 2 | 6 → 2 |
| 7 → 2 | 7 → 2 |
| 4 → 2 | 4 → 2 |
| 6 → 3 | 6 → 3 |
| 2 → 3 | 2 → 3 |
| 5 → 3 | 5 → 3 |
| 7 → 4 | 7 → 4 |
| 1 → 4 | 1 → 4 |

Block 304 performs process loop control by testing whether there are still signals left to process and paths to carry the signals. If no signals remain or if there are no paths still available, the process returns to step 212 of FIG. 2. If at least one signal remains and one path remains, control is directed to block 306, where the cost of each of the paths is determined. Further details on computing the costs of the paths are provided in the discussion accompanying FIG. 4. Therefore, to assist in explaining the invention in terms of the example, the discussion will now move to FIG. 4 before completing the discussion of FIG. 3.

Figure 4:
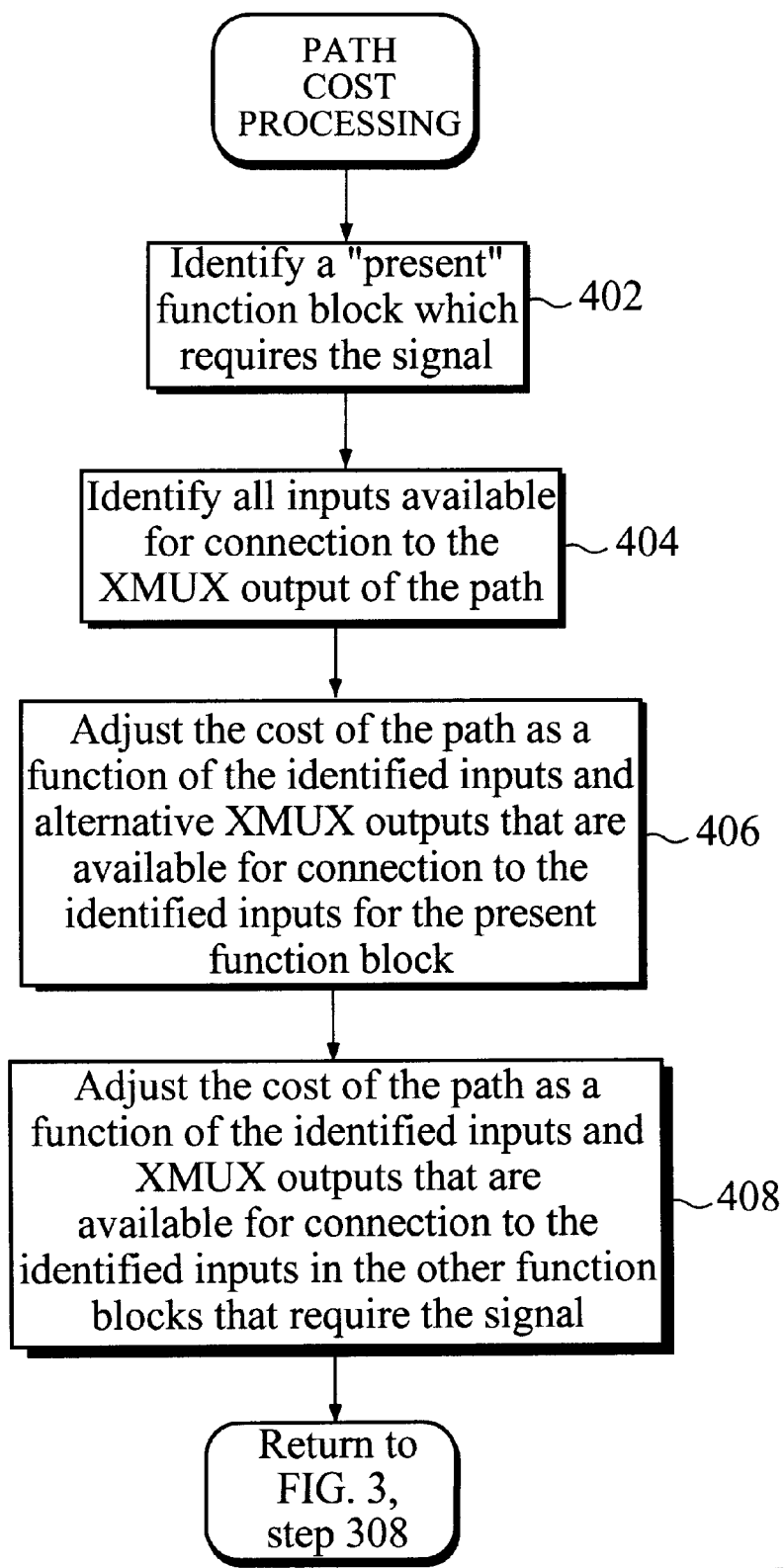
FIG. 4 is a flowchart of an example method for establishing the cost of XMUX paths relative to a signal to be assigned to an XMUX path.

FIG. 4 is a flowchart of an example method for establishing the cost of XMUX paths relative to a signal to be assigned to an XMUX path. At block 402, one of the function blocks which requires the signal in process is identified for the purpose of establishing the relative costs of the paths. Signal A and FB1 are used initially in the example.

The processing of blocks 404, 406, and 408 is performed for each of the paths for FB1 and then for each of the paths for FB2.

According to the list of paths for FB1, path 1→0 is the first to process. At block 404, the other inputs that are assigned to XMUX output 0 are identified, i.e., inputs 2 and 3. These other inputs 2 and 3, along with output 0, are used to determine the cost of path 1→0.

In general, the cost for a path is determined as follows. Recall that the present invention uses a minimal cost function, relative to paired inputs and outputs, to route a signal. The cost function minimizes the impact of assigning a signal to a particular path by choosing a path that leaves the greatest number of other paths available for routing other signals.

Let x be a reference to an XMUX input and y be a reference to an XMUX output, where n inputs, $x_1, x_2, \ldots, x_n$ are mapped to y. Then, $$c_{x,y} = f1 + f2$$

where $c_{x,y}$ is the cost of routing signal, a, to a path having input, x, and output, y f1 is a function of other outputs available for inputs $x_{1-n}$ mapped to y in present FB + f2 is a function of other outputs available for inputs $x_{1-n}$ mapped to y in other FBs requiring a.

This equation is evaluated as $$c_{x,y} = \sum_{j=1}^{j=n} \frac{1}{\text{total alternative outputs for } x_j \text{ in current } FB} + \sum_{j=1}^{j=n} \frac{1}{\text{total outputs for } x_j \text{ in other } FBs \text{ that require signal } a}$$

It will be appreciated that the cost of a path, as adjusted at block 406, is a function of the identified inputs and alternative XMUX outputs that are available in the present function block. This function is:

$$\sum_{j=1}^{j=n} \frac{1}{\text{total alternative outputs for } x_j \text{ in current } FB}$$

Furthermore, the cost of a path as adjusted at block 408, is a function of the identified inputs and XMUX outputs that are available in the other function blocks. This function is:

$$\sum_{j=1}^{j=n} \frac{1}{\text{total outputs for } x_j \text{ in other } FBs \text{ that require signal } a}$$

Note that when the total alternative outputs for $x_j$ in current FB is 0, the function, f1, is set to infinity. Likewise, when the total outputs for $x_j$ in other FBs that require signal a is 0, the function, f2, is set to infinity. In the actual implementation, a very large number is used to represent infinity.

Returning now to the example, it can be seen that the cost of routing signal A to FB1 via path 1→0 is:

$$\frac{1}{\text{input 1 alternatives}} + \frac{1}{\text{input 2 alternatives}} +$$
$$\frac{1}{\text{input 3 alternatives}} + \frac{1}{\text{input 1 outputs in other } FBs} +$$
$$\frac{1}{\text{input 2 outputs in other } FBs} + \frac{1}{\text{input 3 outputs in other } FBs} =$$
$$(1/1 + 1/1 + 1/1) + (1/2 + 1/2 + 1/2) = 4\ 1/2$$

Similar computations show that the cost of routing signal A to FB2 via path 1→0 is 4½. The costs for routing signal A via the other paths having XMUX output 0 are also 4½. For this example, the costs of paths having XMUX outputs 1, 2, and 3 are also 4½, and the costs of paths having XMUX output 4 are 3. A table of paths and their associated costs is shown below.

| FB1 input/output | Cost | FB2 input/output | Cost |
|---|---|---|---|
| 1 → 0 | 4½ | 1 → 0 | 4½ |
| 2 → 0 | 4½ | 2 → 0 | 4½ |
| 3 → 0 | 4½ | 3 → 0 | 4½ |
| 4 → 1 | 4½ | 4 → 1 | 4½ |
| 5 → 1 | 4½ | 5 → 1 | 4½ |
| 3 → 1 | 4½ | 3 → 1 | 4½ |
| 6 → 2 | 4½ | 6 → 2 | 4½ |
| 7 → 2 | 4½ | 7 → 2 | 4½ |
| 4 → 2 | 4½ | 4 → 2 | 4½ |
| 6 → 3 | 4½ | 6 → 3 | 4½ |
| 2 → 3 | 4½ | 2 → 3 | 4½ |
| 5 → 3 | 4½ | 5 → 3 | 4½ |
| 7 → 4 | 3 | 7 → 4 | 3 |
| 1 → 4 | 3 | 1 → 4 | 3 |

Returning now to FIG. 3, at block 308, the path having the least cost is selected. Therefore, routing signal A via path 1→4 has the least cost and is selected for both FB1 and FB2. It will be appreciated that path 7→4 could have been alternatively selected. Signal A is assigned to path 1→4 for FB1 and to path 1→4 for FB2 at block 310. Recall that each function block has its own set of XMUX outputs. Therefore, while input 1 is the same for both paths, the outputs 4 are different. After removing signal A from the list of signals to process, those signals remaining are:

B C D E F

At block 312, the selected path and alternative paths for the input of the selected path are removed from the list of available paths. That is, for the paths of FB1 and FB2, paths having input 1 are no longer available for assignment and must be removed. Therefore, the selected path 1→4 is removed, along with the alternative path 1→0 for both FB1 and FB2. At block 314, paths that conflict with the output of the selected path are removed from further consideration. Therefore, for FB1, path 7→4 is removed, and for FB2, path 7→4 is removed. After removing alternative paths for input 1 in FB1 and in FB2 and paths that conflict with output 4 in FB1 and FB2, the following paths remain:

| FB1 input/output | FB2 input/output |
|---|---|
| 2 → 0 | 2 → 0 |
| 3 → 0 | 3 → 0 |

-continued

| FB1 input/output | FB2 input/output |
|---|---|
| 4 → 1 | 4 → 1 |
| 5 → 1 | 5 → 1 |
| 3 → 1 | 3 → 1 |
| 6 → 2 | 6 → 2 |
| 7 → 2 | 7 → 2 |
| 4 → 2 | 4 → 2 |
| 6 → 3 | 6 → 3 |
| 2 → 3 | 2 → 3 |
| 5 → 3 | 5 → 3 |

Continuing with the example and repeating the processing of FIGS. 3 and 4 as described above, the next signal to process is signal B. The cost of routing signal B to FB1 via path 2→0 is:

$$\frac{1}{\text{input 2 alternatives}} + \frac{1}{\text{input 3 alternatives}} +$$
$$\frac{1}{\text{input 2 outputs in other } FBs} + \frac{1}{\text{input 3 outputs in other } FBs}$$

Similar computations show that the cost of routing signal B to FB2 via path 2→0 is 3. The costs for routing signal B via the other paths having XMUX output 0 are also 3. For this example, the costs of paths having XMUX outputs 1, 2, and 3 are 4½. A table of remaining paths and their associated costs are shown below.

| FB1 input/output | Cost | FB2 input/output | Cost |
|---|---|---|---|
| 2 → 0 | 3 | 2 → 0 | 3 |
| 3 → 0 | 3 | 3 → 0 | 3 |
| 4 → 1 | 4½ | 4 → 1 | 4½ |
| 5 → 1 | 4½ | 5 → 1 | 4½ |
| 3 → 1 | 4½ | 3 → 1 | 4½ |
| 6 → 2 | infinity | 6 → 2 | infinity |
| 7 → 2 | infinity | 7 → 2 | infinity |
| 4 → 2 | infinity | 4 → 2 | infinity |
| 6 → 3 | 4½ | 6 → 3 | 4½ |
| 2 → 3 | 4½ | 2 → 3 | 4½ |
| 5 → 3 | 4½ | 5 → 3 | 4½ |

Routing signal B via path 2→0 has the least cost and is selected for both FB1 and FB2. The signals remaining to be processed are:

C D E F

After removing alternative paths for input 2 and paths that conflict with output 0, the following paths remain:

| FB1 input/output | FB2 input/output |
|---|---|
| 4 → 1 | 4 → 1 |
| 5 → 1 | 5 → 1 |
| 3 → 1 | 3 → 1 |
| 6 → 2 | 6 → 2 |
| 7 → 2 | 7 → 2 |
| 4 → 2 | 4 → 2 |
| 6 → 3 | 6 → 3 |
| 5 → 3 | 5 → 3 |

The costs of routing signal C are shown in the table below:

| FB1 input/output | Cost | FB2 input/output | Cost |
|---|---|---|---|
| 4 → 1 | infinity | 4 → 1 | infinity |
| 5 → 1 | infinity | 5 → 1 | infinity |
| 3 → 1 | infinity | 3 → 1 | infinity |
| 6 → 2 | infinity | 6 → 2 | infinity |
| 7 → 2 | infinity | 7 → 2 | infinity |
| 4 → 2 | infinity | 4 → 2 | infinity |
| 6 → 3 | 3 | 6 → 3 | 3 |
| 5 → 3 | 3 | 5 → 3 | 3 |

Therefore, routing signal C via path 6→3 has the least cost and is selected for both FB1 and FB2. The signals remaining to be processed are:

D E F

The following table shows the remaining paths and their associated costs after removing alternative paths for input 6 and paths that conflict with output 3

| FB1 input/output | Cost | FB2 input/output | Cost |
|---|---|---|---|
| 4 → 1 | 2 * infinity | 4 → 1 | 2 * infinity |
| 5 → 1 | 2 * infinity | 5 → 1 | 2 * infinity |
| 3 → 1 | 2 * infinity | 3 → 1 | 2 * infinity |
| 7 → 2 | infinity | 7 → 2 | infinity |
| 4 → 2 | infinity | 4 → 2 | infinity |

Recall that "infinity" is represented as a very large number. Therefore, "2*infinity" is equal to the very large number multiplied by two. Path 4→2 is selected to route signal D to FB1 and FB2. The remaining signals are E and F. The following table shows the remaining paths after removing alternative paths for input 4 and paths that conflict with output 2.

| FB1 input/output | FB2 input/output |
|---|---|
| 5 → 1 | 5 → 1 |
| 3 → 1 | 3 → 1 |

For path 3→1, input 3 has no alternatives in FB1 and the cost is set to infinity. The same is true for path 5→1. Either path can be selected for routing signal E to FB1. Therefore, signal E is assigned to path 3→1 for FB1, and path 5→1 remains available for routing signal F to FB2. Recall that FB2 does not require signal E, and FB1 does not require signal F. Thus, signal F is assigned to path 5→1 as the final step in the process.

Figure 5:
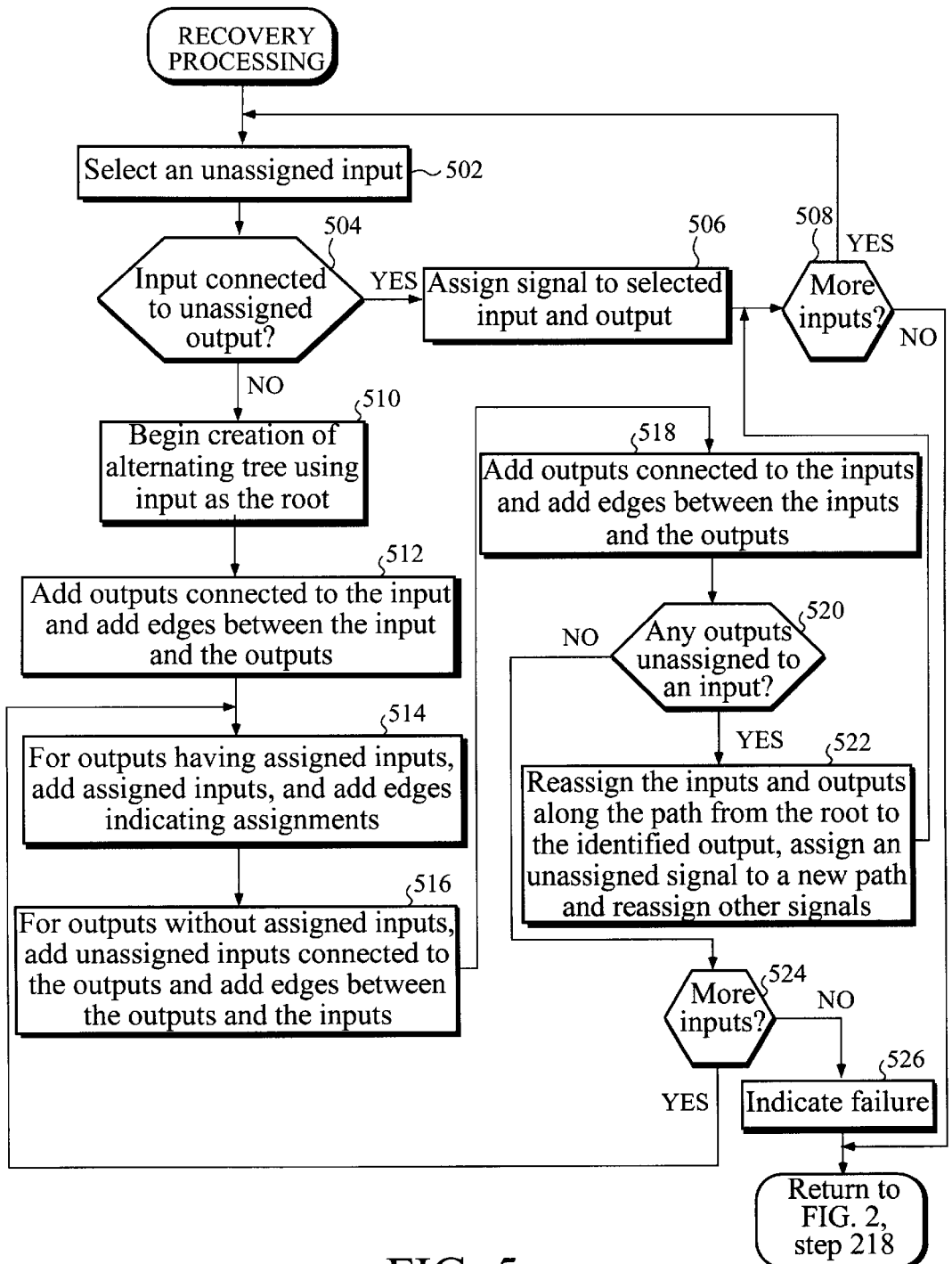
FIG. 5 is a flowchart of an example method for recovery processing that is performed if the signal assignment processing of FIGS. 3 and 4 fails to assign all signals to XMUX paths.

FIG. 5 is a flowchart of an example method for recovery processing that is performed at step 216 of FIG. 2 if the signal assignment processing of FIGS. 3 and 4 fails to assign all signals to XMUX paths. Another example is provided along with the description of FIG. 5 to assist in explanation of the method. The method of FIG. 5 is an adaptation of the Hungarian Algorithm. The recovery method supplements the method of FIGS. 3 and 4 to improve the chances of successfully assigning all signals to XMUX paths.

During the course of recovery processing, some reassignments may be made to accommodate unrouted signals. The recovery process considers XMUX input/output assignments as a whole, and, therefore, reassignments may occur between function blocks. Reassigning signals and XMUX paths between function blocks is a departure from the prior art. Before considering the processing, it will be helpful to define some necessary terms.

Figure 6:
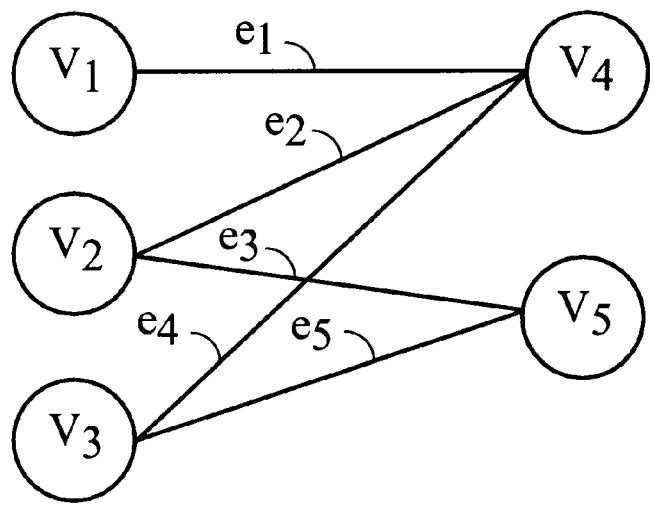
FIG. 6 is an example graph having a set of vertices and a set of edges.

The XMUX structure is modeled as a graph, G, composed of a set of vertices and a set of edges. An example graph having vertices={$V_1, V_2, V_3, V_4, V_5$} and edges={$e_1, e_2, e_3, e_4, e_5$} is shown in FIG. 6. Specifically, the graph is bipartite with vertices on the left side connected with vertices on the right. The XMUX inputs are modeled as the vertices on the left, and the XMUX outputs are modeled as the vertices on the right. An edge connects a left side vertex with a right side vertex if the corresponding XMUX input is connectable to the corresponding XMUX output. The connected vertices are neighbors of each other.

Figure 7:
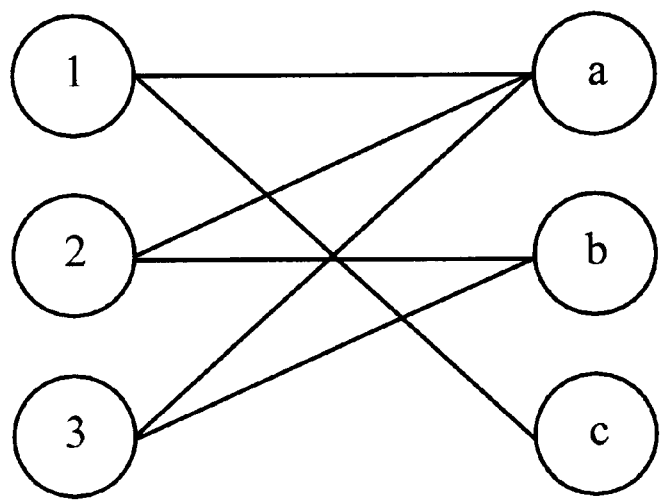
FIG. 7 is an example graph of XMUX inputs that are connectable to XMUX outputs.

The following example XMUX information is depicted in the graph of FIG. 7.

| XMUX output | XMUX inputs | | |
|---|---|---|---|
| a | 1 | 2 | 3 |
| b | 2 | 3 | |
| c | 1 | | |

It will be appreciated that outputs a and c are neighbors of input 1, and outputs a and b are neighbors of inputs 2 and 3.

Figure 8:
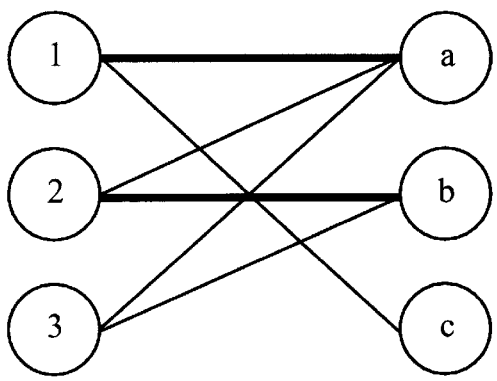
FIG. 8 is an example graph that illustrates assignments/matchings of inputs to outputs.

A "matching" is a pairing between a left side vertex and a right side vertex, as depicted by a connecting edge. As applied to the XMUX example, a matching is accomplished by assigning a signal to an input/output pair. A vertex that is not matched is referred to as a single vertex. FIG. 8 illustrates that vertex 1 is matched with vertex a, and vertex 2 is matched with vertex b, as indicated by the respective bold connecting edges. It can be seen that with the matchings of FIG. 8, vertices 3 and c are single.

Figure 9:
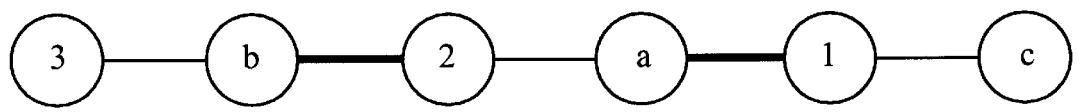
FIG. 9 illustrates an example alternating path.

For the purposes of this discussion, a "tree" is a graph with a root and children. Each child has only one parent, but a parent may have one or more children. A tree will be used later in the specific example. An alternating path is a path alternatively composed of matched and non-matched vertex pairs, as shown by FIG. 9. Later, in the discussion of the specific example, it will be seen that the alternating path exists in a tree that is constructed by the method.

FIG. 9 shows an augmenting path, that is, a path that begins and ends with single vertices. Augmenting refers to the fact that an additional matching can be added to the path. In FIG. 9, note that vertices 3 and c are unmatched, and that an alternate combination of matchings results in all vertices being matched.

Figure 10:
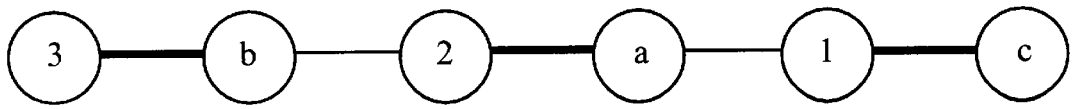
FIG. 10 shows the path of FIG. 9 after augmentation.

FIG. 10 shows the path of FIG. 9 after augmentation. By reassigning input 3 to output b, input 2 to output a, and input 1 to output c, all inputs are assigned to outputs, in contrast to the assignments depicted in FIG. 9. The objective of the recovery method is, therefore, to reassign inputs to outputs so that all signals are assigned to input/output pairs. The method described in FIG. 5 constructs trees using conventional data structures in attempts to identify augmenting paths. When an augmenting path is identified, all vertices in the path are rematched/reassigned.

The discussion of FIG. 5 uses the example set forth with FIGS. 7–10. The matching illustrated in FIG. 8 is assumed to be input to the recovery process. Recall that input 1 is assigned to output a, input 2 is assigned to output b, and input 3 is unassigned. At block 502, an unassigned input is selected, for example, input 3. Block 504 tests whether the XMUX input is connected to an unassigned XMUX output.

If so, control is directed to block 506, where the input and output are paired and a signal is assigned to the path, and then to block 508 to test whether there are more inputs to process. As shown in FIG. 8, input 3 is connected to outputs a and b, both of which are already assigned.

Block 504 directs control to block 510 if the input is not connectable to an unassigned output. At block 510, the process of creating an alternating tree begins, where an alternating tree is a tree having connections between vertices alternating with neighboring unconnected vertices. The selected input is used as the root of the tree.

Figure 12:
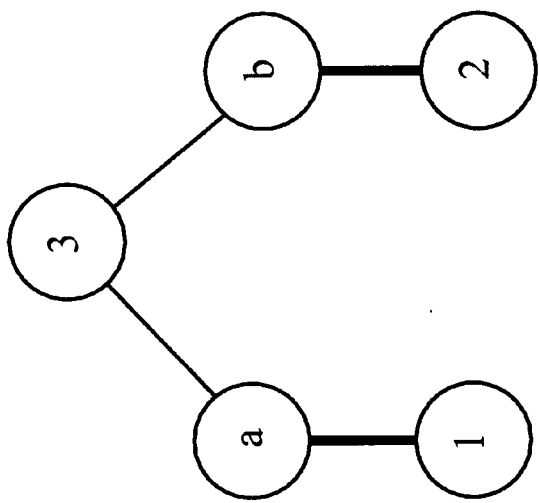
FIG. 12 is a further example tree-type graph constructed in accordance with the processing of FIG. 5.
Figure 11:
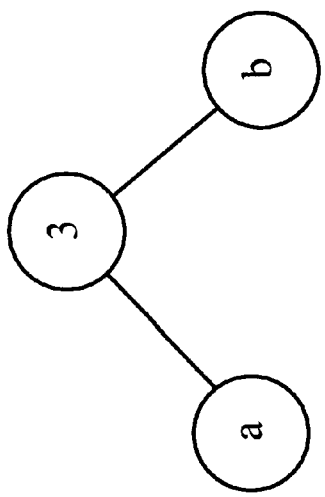
FIG. 11 is an example tree-type graph constructed in accordance with the processing of FIG 5.

The outputs that are connectable to the input are added to the tree at block 512, where edges connect the root and the outputs, respectively. FIG. 11 shows that, with input 3 as the root, outputs a and b are added to the tree. At block 514, for the outputs at the lowest level of the tree, e.g., a and b, those outputs having matched/assigned inputs have their respective inputs added to the tree with connecting edges, if the input is not already part of the tree. FIG. 12 shows the addition of respective inputs 1 and 2. Matched inputs and outputs are indicated with bold edges in FIG. 12 and can be implemented with an appropriate tag in the tree data structure, for example.

Figure 13:
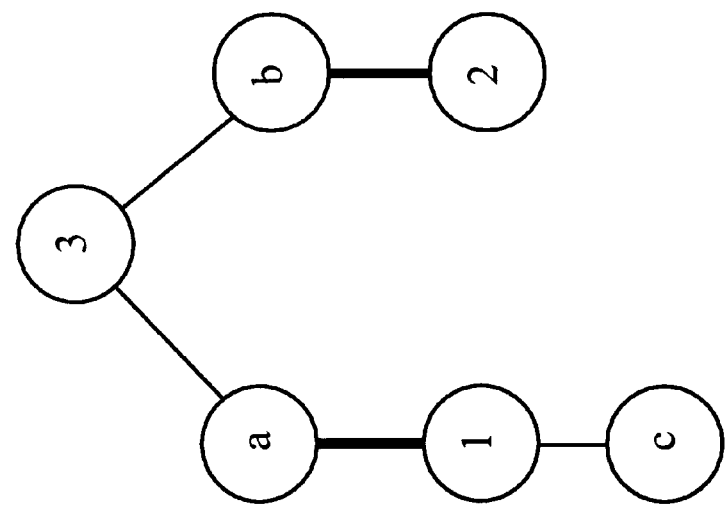
FIG. 13 is yet a further example tree-type graph.

For outputs without assigned inputs, the inputs that are connected to the outputs are added to the tree at block 516. In the present example, there are no outputs having unassigned inputs. Continuing now with block 518, outputs that are connected to the lowest level inputs are added to the tree. FIG. 13 illustrates the addition of output c that is connected to input 1.

Figure 14:
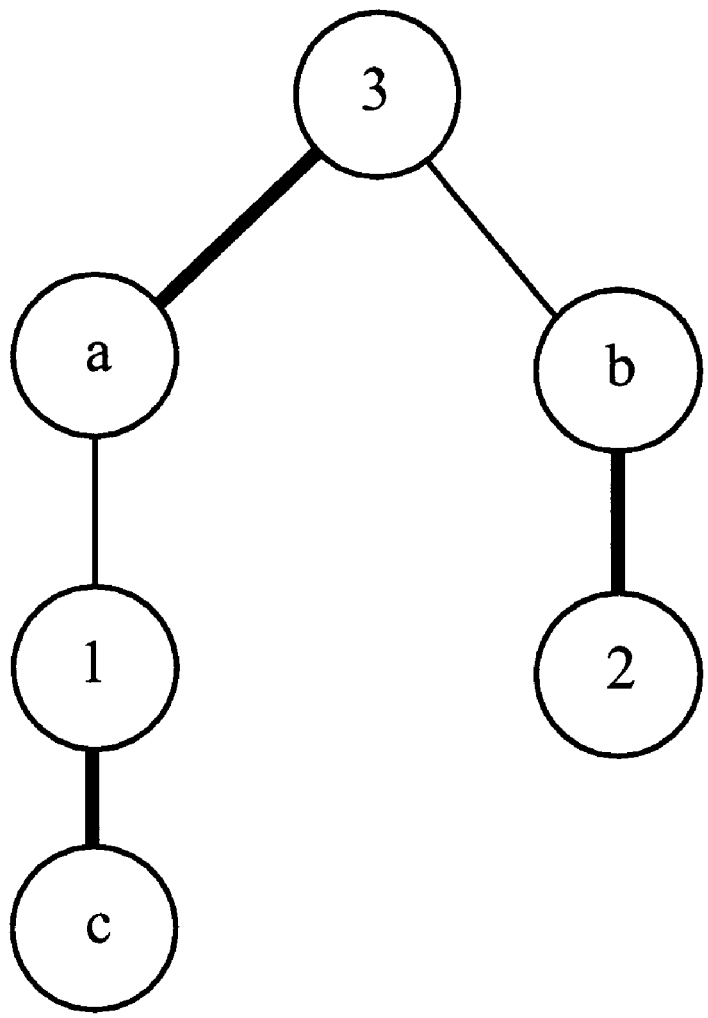
FIG. 14 is an example tree-type graph after an augmenting path has been augmented.

At block 520, the process tests whether the outputs at the lowest level of the tree are unmatched/unassigned to an input. In the example, it can be seen that output c is not assigned to an input. Therefore, by definition, an augmenting path has been identified, and control is directed to block 522. The inputs and outputs along the augmenting path are reassigned in block 522 and as illustrated in FIG. 14. Input 3 is reassigned to output a, and input 1 is reassigned to output c instead of output a. The signals formerly assigned to old paths, e.g., 1→a, are reassigned to the paths having the same outputs as in the old paths. For example, a signal $a_1$ formerly assigned to path 1→a is reassigned to path 3→a. A signal that was not originally assigned to a path is assigned to the new path 1→c. Control is then directed to block 508 to test whether there are more inputs to process.

Returning now to block 520, if there are not any outputs which are not assigned to an input, control is directed to block 524 to test whether there are more inputs to add to the tree. If not, block 526 indicates a failure to assign all the signals to XMUX paths. Otherwise, control is directed to block 514 to add more inputs to the tree.

Accordingly, the present invention provides, among other aspects, a method and apparatus for assigning signals to input and output resources of an interconnect array for a PLD. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for assigning signals required by function blocks of a programmable integrated circuit to interconnect multiplexer input resources and assigning the interconnect multiplexer input resources to interconnect multiplexer output resources, comprising the steps of:

(a) identifying all available paths from an interconnect multiplexer input resource to an interconnect multiplexer output resource;

(b) determining a signal that has a greatest number of function blocks that require the signal and that is not assigned to a path, and determining a cost of each path not having an assigned signal, wherein the cost of a path for one of the function blocks that requires the signal is a function of a number of other output resources that are available for other input resources that are mapped to the output resource of the path for the one function block;

(c) selecting a path having the least cost;

(d) assigning the signal to the path selected; and (e) repeating steps (b)–(d) until all the signals have been assigned.

2. The method of claim 1, further comprising the step of sorting the signals by numbers of function blocks which require the signals.

3. The method of claim 2, further comprising the steps of:

removing from consideration for assignment alternative paths for input resource of the path selected; and removing from consideration for assignment conflicting paths for output resource of the path selected.

4. The method of claim 1, wherein for n inputs, $x_1, x_2, \ldots, x_n$, mapped to an output resource, y, the cost of the path for the one function block is a function of:

$$\sum_{j=1}^{j=n} \frac{1}{\text{total alternative outputs for } x_j \text{ in one function block.}}$$

5. The method of claim 1, wherein the cost of a path for the one function block is a function of a number of output resources that are available for the other input resources that are mapped to the output resource of the path for other function blocks that require the signal.

6. The method of claim 5, wherein for n inputs $x_1, x_2, \ldots, x_n$, mapped to an output resource y, the cost of the path for the one function block is a function of:

$$\sum_{j=1}^{j=n} \frac{1}{\text{total outputs for } x_j \text{ in other function blocks that require the signal.}}$$

7. The method of claim 1, further comprising the steps of:

(f) selecting an unassigned input resource to create a tree-type data structure having as a root the unassigned input resource;

(g) adding to the tree output resources that are connectable to the unassigned input resource;

(h) adding below a lowest level of the tree, input resources that are assigned to the output resources;

(i) adding below a lowest level of the tree, output resources that are connectable to corresponding input resources;

(j) if an output resource at a lowest level of the tree is not assigned to an input resource, then in an augmenting path that begins with the unassigned input resource at the root and ends at the output resource at the lowest level of the tree, reassigning input resources to neighboring output resources to create an alternating path of input resources assigned to output resources, assigning an unassigned signal to one of the input resources assigned to output resources in the alternating path, and reassigning signals of the augmenting path to inputs assigned to output resources in the alternating path;

(k) repeating steps (f)–(j) until all the signals are assigned to interconnect multiplexer paths.

8. The method of claim 7, further comprising the step of repeating steps (h)–(i) until either there are no remaining input resources and output resources to add to the tree or an output resource at a lowest level of the tree is not assigned to an input resource.

9. The method of claim 8, further comprising the step of:

indicating a failure if there are no remaining input resources and output resources to add to the tree and there is no output resource at a lowest level of the tree that is not assigned to an input resource.

10. A method for assigning signals required by function blocks of a programmable circuit to interconnect multiplexer input resources assigning the interconnect multiplexer input resources to interconnect multiplexer output resources, comprising the steps of:

(a) identifying all available paths from an interconnect multiplexer input resource to an interconnect multiplexer output resource;

(b) sorting the signals by numbers of function blocks which require the signals, the sorting involving determining a signal that has a greatest number of function blocks that require the signal and that is not assigned to a path, and determining a cost of each path not having an assigned signal, wherein the cost of a path for one function block is a function of a number of output resources that are available for the other input resources that are mapped to the output resource of the path for other function blocks that require the signal;

(c) selecting a path having the least cost the selecting involving: 1) removing from consideration for signal assignment alternative paths for the input resource of the path selected, and 2) removing from consideration for signal assignment conflicting paths for the output resource of the path selected:

(d) assigning the signal to the path selected; and (e) repeating steps (b)–(d) until all the signals have been assigned.

11. The method of claim 10, wherein for an input resource i and an output resource o, where n inputs, $x_1, x_2, \ldots, x_n$, are mapped to o, the cost of the path for the one function block is a function of:

$$\sum_{j=1}^{j=n} \frac{1}{\text{total outputs for } x_j \text{ in other function blocks that require the signal.}}$$

12. An apparatus for assigning signals required by function blocks of a programmable integrated circuit to interconnect multiplexer input resources and assigning the interconnect multiplexer input resources to interconnect multiplexer output resources, comprising:

means for identifying all available paths from an interconnect multiplexer input resource to an interconnect multiplexer output resource;

for a signal that has a greatest fanout to function blocks and that is not assigned to a path, means for determining a cost of each path not in use, wherein the cost of a path for one of the function blocks that requires the signal is a function of a number of other output resources that are available for other input resources that are mapped to the output resource of the one path for the one function means for selecting a path having the least cost;

means for assigning the signal to the path selected; and means for repeating determination of the cost of each path, selection of a path, and assignment of a signal until all the signals have been assigned.

13. The apparatus of claim 12, further comprising means for sorting the signals by numbers of function blocks which require the signals.

14. The apparatus of claim 13, further comprising:

means for removing from consideration for assignment alternative paths for input resource of the path selected; and means for removing from consideration for assignment conflicting paths for output resource of the path selected.

15. The apparatus of claim 13, wherein for n inputs, $x_1, x_2, \ldots, x_n$, mapped to an output resource, y, the cost of the path for the one function block is a function of:

$$\sum_{j=1}^{j=n} \frac{1}{\text{total alternative outputs for } x_j \text{ in one function block.}}$$

16. The apparatus of claim 13, wherein the cost of a path for the one function block is a function of a number of output resources that are available for the other input resources that are mapped to the output resource of the path for other function blocks that require the signal.

17. The apparatus of claim 16, wherein for n inputs, $x_1, x_2, \ldots, x_n$ mapped to an output resource, y, the cost of the path for the one function block is a function of:

$$\sum_{j=1}^{j=n} \frac{1}{\text{total outputs for } x_j \text{ in other function blocks that require the signal.}}$$

18. The apparatus of claim 12, further comprising:

means for selecting an unassigned input resource to create a tree-type data structure having as a root the unassigned input resource;

means for adding to the tree output resources that are connectable to the unassigned input resource;

means for adding below a lowest level of the tree, input resources that are assigned to the output resources;

means for adding below a lowest level of the tree, output resources that are connectable to corresponding input resources;

means for reassigning input resources to neighboring output resources to create an alternating path of input resources assigned to output resources in an augmenting path that begins with the unassigned input resource at the root and ends at the output resource at the lowest level of the tree, if an output resource at a lowest level of the tree is not assigned to an input resource;

means for assigning an unassigned signal to one of the input resources assigned to output resources in the alternating path, if an output resource at a lowest level of the tree is not assigned to an input resource;

means for reassigning signals of the augmenting path to inputs assigned to output resources in the alternating path, if an output resource at a lowest level of the tree is not assigned to an input resource; and means for repeating selection of unassigned inputs, construction of trees having alternating paths, and reassigning signals until all the signals are assigned to interconnect multiplexer paths.

19. An apparatus for assigning signals required by function blocks of a programmable integrated circuit to interconnect multiplexer input resources and assigning the interconnect multiplexer input resources, to interconnect multiplexer output resources, comprising:

means for identifying all available paths from an interconnect multiplexer input resource to an interconnect multiplexer output resource;

for a signal that has a greatest fanout to function blocks and that is not assigned to a path, means for determining a cost of each path not in use, wherein the cost of a path for one of the function blocks that requires the signal is a function of a number of output resources that are available for the other input resources that are mapped to the output resource of the path for other function blocks that require the signal;

means for selecting a path having the least cost;

means for assigning the signal to the path selected; and means for repeating determination of the cost of each path, selection of a path, and assignment of a signal until all the signals have been assigned.

20. The apparatus of claim 19, wherein for n inputs, $x_1, x_2, \ldots, x_n$, an output resource, y, mapped to the cost of the path for the one function block is a function of:

$$\sum_{j=1}^{j=n} \frac{1}{\text{total outputs for } x_j \text{ in other function blocks that require the signal}}$$

21. A computer readable medium comprising instructions for causing a computer to assign signals required by function blocks of a programmable integrated circuit to interconnect multiplexer input resources and assign the interconnect multiplexer input resources to interconnect multiplexer output resources, the instructions for causing the computer to perform the steps of:

(a) identifying all available paths from an interconnect multiplexer input resource to an interconnect multiplexer output resource;

(b) for a signal that has a greatest number of function blocks that require the signal and that is not assigned to a path, determining a cost of each path not having an assigned signal, wherein the cost of a path for one of the function blocks is a function of a number of other output resources that are available for other input resources, the other input resources being mapped to the output resource of the path for the one function block;

(c) selecting a path having the least cost;

(d) assigning the signal to the path selected; and (e) repeating steps (b)–(d) until all the signals have been assigned.

22. A method for assigning a plurality of signals to paths within the programmable logic device, the programmable logic device including an interconnect multiplexer and a plurality of function blocks, each of the paths being a path from an interconnect multiplexer input to an interconnect multiplexer output, the method comprising the steps of:

(a) viewing all function blocks of the programmable logic device and determining a signal of the plurality of signals that has a greatest number of function blocks that require the signal and that is not assigned to a path;

(b) for the signal determined in (a), determining a cost of each path that the signal can be routed on but that does not have an assigned signal, wherein the cost of a path for one of the function blocks is a function of a number of other output resources that are available for other input resources, the other input resources being mapped to the output resource of the path for the one function block;

(c) selecting the path in (b) having the least cost;

(d) assigning the signal to the path selected in (c); and (e) repeating steps (a)–(d) until all the plurality of signals have been assigned.

* * * * *

UNITED STATES PATENT AND TRADEMARK OFFICE
CERTIFICATE OF CORRECTION

PATENT NO. : 6,199,192 B1
DATED : March 6, 2001
INVENTOR(S) : Jose M. Marquez et al.

It is certified that error appears in the above-identified patent and that said Letters Patent is hereby corrected as shown below:

Title page,
Item [73], Assignee, the name "Xilinix, Inc." should read -- Xilinx, Inc. --

Signed and Sealed this

Twenty-first Day of June, 2005

JON W. DUDAS
*Director of the United States Patent and Trademark Office*